United States Patent [19]
Kotani et al.

[11] Patent Number: 5,767,714
[45] Date of Patent: Jun. 16, 1998

[54] PLL CIRCUIT AND DIGITAL SIGNAL REPRODUCING APPARATUS

[75] Inventors: Yasutaka Kotani, Tokyo; Yasuo Sakura, Kanagawa; Shiro Miyagi, Tokyo, all of Japan

[73] Assignee: Sony Corporation, Tokyo, Japan

[21] Appl. No.: 723,253

[22] Filed: Sep. 30, 1996

[30] Foreign Application Priority Data

Oct. 25, 1995 [JP] Japan ................... 7-300703

[51] Int. Cl.[6] ........................... H03L 7/093
[52] U.S. Cl. ................. 327/156; 327/147; 327/553; 331/17
[58] Field of Search ................. 327/147–150, 327/156–159, 553, 552; 331/17, 15

[56] References Cited

U.S. PATENT DOCUMENTS

| | | | |
|---|---|---|---|
| 3,694,776 | 9/1972 | Linder | 331/17 |
| 5,144,156 | 9/1992 | Kawasaki | 331/17 |
| 5,382,838 | 1/1995 | Sasaki et al. | 327/108 |
| 5,499,392 | 3/1996 | Grunwell | 331/17 |
| 5,570,398 | 10/1996 | Smith | 331/17 |

OTHER PUBLICATIONS

Cox et al., "Phase–locked oscillator initialization", IBM Technical Disclosure Bulletin, vol. 14, No. 14, p. 1222, Sep. 1971.

*Primary Examiner*—Timothy P. Callahan
*Assistant Examiner*—T. T. Lam
*Attorney, Agent, or Firm*—Frommer Lawrence & Haug LLP; William S. Frommer

[57] ABSTRACT

A PLL circuit which is used as a reproducing clock forming circuit of a digital signal reproducing apparatus. The PLL circuit is strong against noises and has stable characteristics. Comparison outputs of a phase comparator 3 are outputted in a form of balance (differential) signals and are supplied to a loop filer 4. Output signals of the loop filter 4 are supplied to control voltage input terminals of a VCO 5 in a form of the balance signals. In-phase components of the noises included in control voltages can be cancelled. Time constants of the loop filter can be switched by bipolar transistors Tr31 and Tr32. A balance of the balance signals is not broken by base currents of the transistors Tr31 and Tr32.

6 Claims, 6 Drawing Sheets

CONTROL SIGNAL →

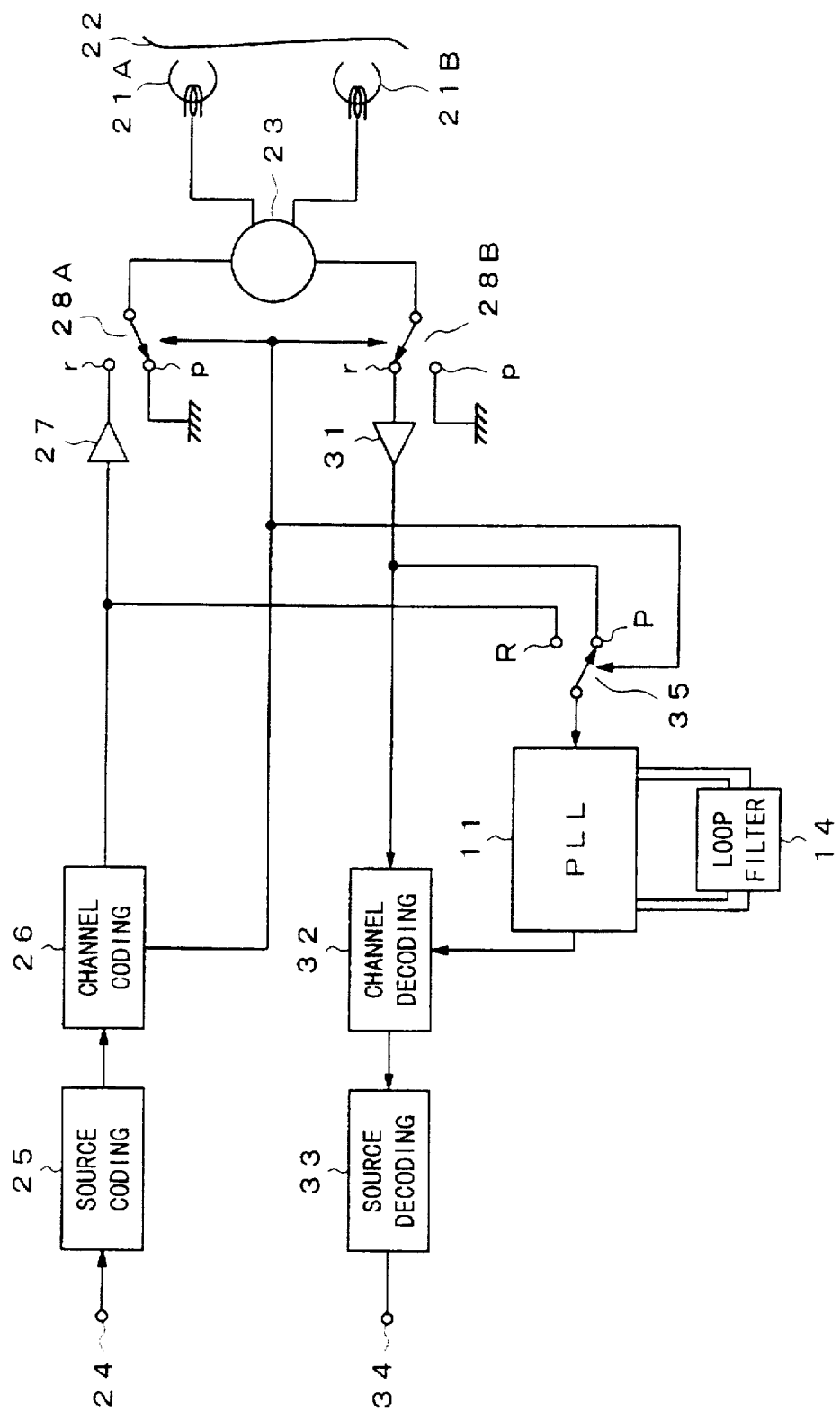

PLL CIRCUIT AND DIGITAL SIGNAL REPRODUCING APPARATUS

BACKGROUND OF THE INVENTION

1. Field of the Invention

The invention relates to a PLL circuit and a digital signal reproducing apparatus in which the PLL circuit is used in a reproducing clock forming circuit.

2. Description of the Prior Art

Hitherto, when a digital signal is recorded onto a magnetic tape, an optical disc, or the like and the digital signal is reproduced, a PLL (Phase Locked Loop) circuit is used to form a reproducing clock synchronized with a reproduction signal. The PLL circuit is constructed by a VCO (Voltage Controlled Oscillator), a phase comparator, and a loop filter. In a digital VTR (Video Tape Recorder) using the PLL circuit, an RF signal of a waveform as shown in FIG. 6 is reproduced in a high speed reproducing mode.

In the high speed reproducing mode, since a pair of heads reproduce a plurality of tracks including tracks whose azimuths don't coincide, in other words, since the azimuths of the tracks to be reproduced are different, an interval at a low signal level occurs. It is, therefore, necessary to switch response characteristics of the PLL from those in a normal reproducing mode. Since the two kinds of response characteristics in the normal reproducing mode and the high speed reproducing mode can be set to predetermined time constants. In the high speed reproducing mode, since there is no preamble and reproduction data immediately exists, the time constant is set to be smaller than that in the normal reproducing mode in which a preamble interval exists and a response speed is made high, so that a larger amount of data can be obtained.

When switching the response characteristics (time constants) as mentioned above, in FIG. 1A, constants of a resistor R2 and a capacitor C1 constructing a loop filter have to be changed. A construction in FIG. 1A shows a part of the PLL, namely, only a loop filter arranged between a phase comparator 1 and a VCO 2. The connection between the phase comparator 1 and VCO 2 is called a balanced (differential) form. The balanced form has an advantage such that an in-phase component of noises during the generation of phase comparison signals is eliminated because of the form of the balanced signals and a construction which is strong against the noises can be obtained and a high sensitive VCO can be used.

When a bipolar transistor is used for switching the response characteristics of the PLL using the balanced form, since a base current flows from a bipolar transistor, a balance relation is broken, so that an FET (Field Effect Transistor) has conventionally been used. A simplest method of switching the two kinds of response characteristics (time constants) by using the FET is a method such that, as shown in FIG. 1B, two kinds of constants of the resistor R2 and capacitor C1 and a resistor R2' and a capacitor C1' are prepared and they are switched by using FETs 1 and 1'.

However, when the PLL is constructed by an IC, if a power source voltage of the IC is low, output currents flowing in the resistors R2 and R2' and capacitors C2 and C2' are equal to hundreds of [µA], so that it is difficult to perfectly switch such weak currents by the low power source voltage by the FET. This is because a potential difference which is applied between a gate and a source of the FET is so high to be a few volts and such an IC cannot be used in case of a circuit of the form as shown in FIG. 1B.

OBJECT OF THE INVENTION

It is, therefore, an object of the invention to provide a PLL of the balanced (differential) form, namely, a PLL circuit and a digital signal reproducing apparatus which can switch response characteristics, operate at a low power source voltage, and can reduce an electric power consumption.

SUMMARY OF THE INVENTION

According to the invention disclosed in claim 1, there is provided a PLL circuit comprising: a VCO; a phase comparator for comparing phases of output signals and input signals of the VCO; and a loop filter inserted between output terminals of the phase comparator and control signal input terminals of the VCO, wherein output signals of the loop filter are switched by switching a first time constant and a second time constant, and output signals of the phase comparator and the output signals of the loop filter in which a first time constant and a second time constant can be switched have a form of balance signals.

According to the invention disclosed in claim 2, there is provided a digital signal reproducing apparatus having a PLL circuit to which a reproduction signal from a recording medium is supplied and which forms a reproducing clock synchronized with the reproduction signal, wherein the PLL circuit is constructed by a VCO, a phase comparator for comparing phases of output signals and input signal of the VCO, and a loop filter inserted between output terminals of the phase comparator and control signal input terminals of the VCO, and output signals of the phase comparator and output signals of the loop filter in which the first and second time constants can be switched in accordance with a reproducing mode of the digital signal reproducing apparatus have a form of the balance signals.

A situation such that charging characteristics and discharging characteristics are different due to a difference of a conducting form of a transistor can be prevented, two kinds of time constants can be easily switched, and further, a deterioration of the characteristics of the PLL circuit can be prevented.

The above and other objects and features of the present invention will become apparent from the following detailed description and the appended claims with reference to the accompanying drawings

BRIEF DESCRIPTION OF THE DRAWINGS

FIG. 7 is a block diagram of an example of a magnetic recording and reproducing apparatus to which the PLL of the invention is applied.

DETAILED DESCRIPTION OF THE PREFERRED EMBODIMENT

Figure 1A:
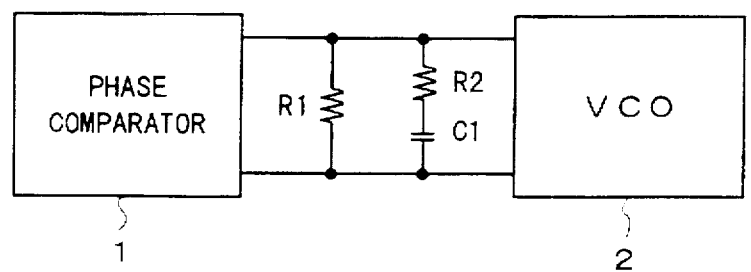
FIGS. 1A and 1B are constructional diagrams of a prior art of a loop filter.
Figure 1B:
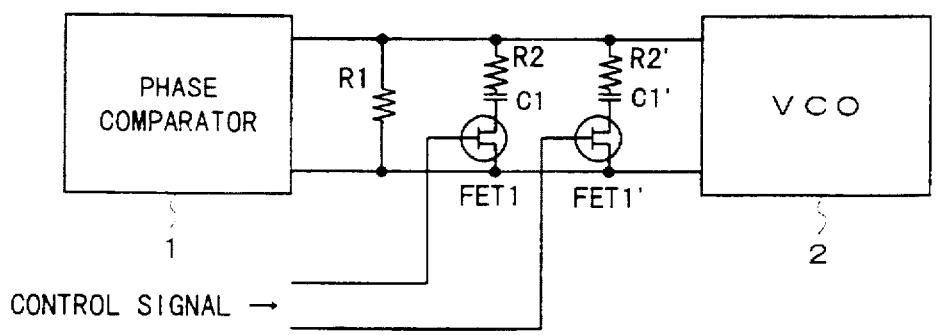
Figure 2:
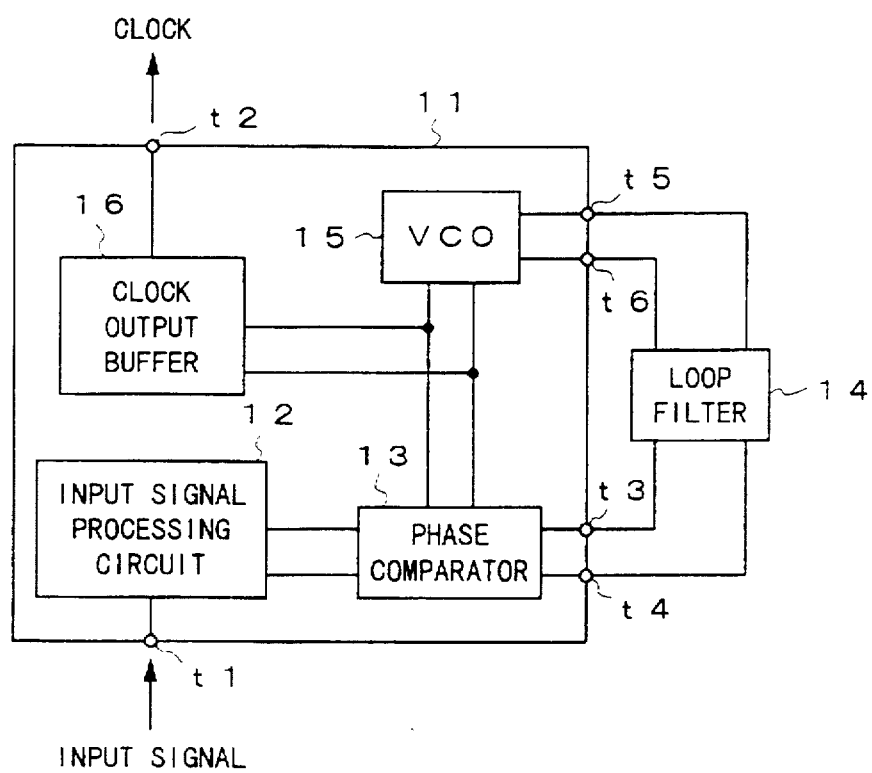
FIG. 2 is a block diagram of an example of a PLL to which the invention is applied.

An embodiment according to the invention will now be described hereinbelow with reference to the drawings. In FIG. 2, an input signal processing circuit 12, a phase comparator 13, a VCO 15, and a clock output buffer 16 are constructed in a PLL-IC shown by a reference numeral 11. An input signal, for example, a reproduction digital signal from a magnetic tape is supplied from an input terminal t1. Processes such as a waveform shaping for extracting a leading edge and a trailing edge of an input signal and the like are performed in the input signal processing circuit 12 and the resultant processed signal is supplied to the phase comparator 13.

Output signals of the VCO 15 are extracted through the clock output buffer 16 to an output terminal t2 and are supplied to the phase comparator 13. The phase comparator 13 compares phases of the outputs of the VCO 15 and the input signals transmitted via the input signal processing circuit 12 and generates comparison outputs to terminals t3 and t4. The comparison outputs are supplied to control voltage input terminals t5 and t6 of the VCO 15 through a loop filter 14 constructed by external parts of the PLL-IC 11.

According to the embodiment, a signal which is inputted/outputted among circuit blocks constructing the PLL circuit mentioned above have a balanced (differential) form. According to the invention, it is at least necessary that a circuit section from the output terminals of the phase comparator 13 through the loop filter 14 to the control voltage input terminals of the VCO 15 has the form of balance signals.

Figure 3A:
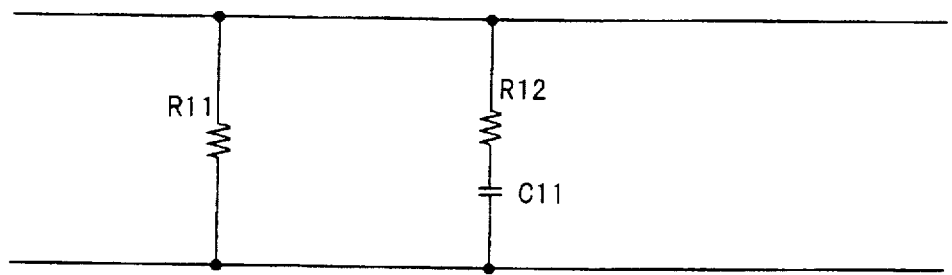
FIGS. 3A to 3C are circuit diagrams of an example which is used for explanation of a loop filter according to the invention.
Figure 3B:
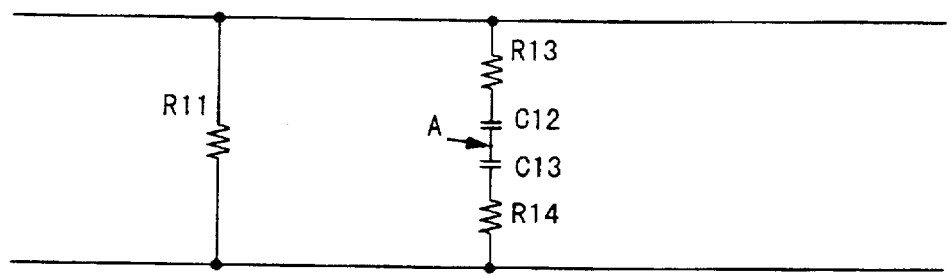
Figure 3C:
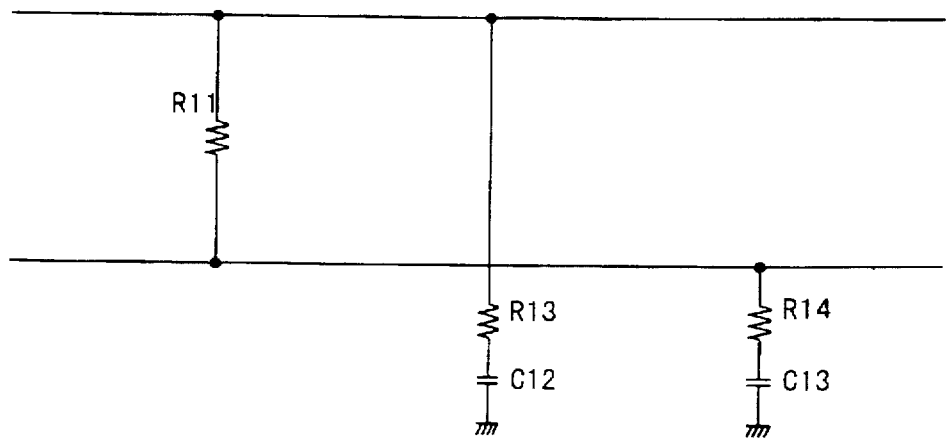

FIGS. 3A to 3C show examples of a circuit construction of the loop filter 14 inserted between the phase comparator 13 and VCO 15 according to the embodiment of the invention. The loop filter 14 shown in FIG. 3A is constructed by a low-pass filter and response characteristics of the PLL can be changed by switching a time constant of the low-pass filter.

The loop filter 14 can be modified to a circuit construction shown in FIG. 3B. In the construction of FIG. 3B, capacitors C12 and C13 have a capacity that is twice as large as that of a capacitor C11 (C11×2=C12=C13). Further, even when resistors R13 and R14 have a resistance that is the half of a resistance of a resistor R12 (R12/2=R13=R14), a similar effect is derived. In FIG. 3B, since an electric potential at a connection point A of the capacitors C12 and C13 exerts no influence on the operation of the circuit, the loop filter can be further modified to a circuit shown in FIG. 3C.

Figure 4A:
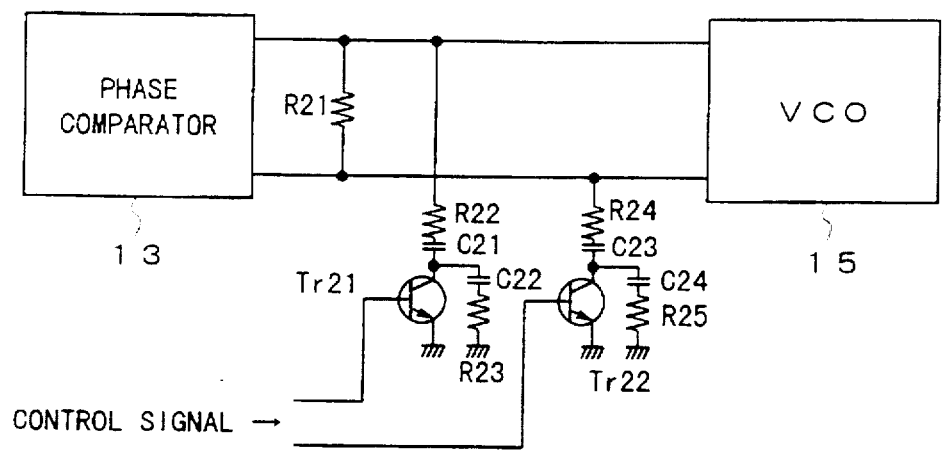
FIGS. 4A to 4C are circuit diagrams of the loop filter according to an embodiment of the invention.

FIG. 4A shows an embodiment of a circuit construction which realizes the switching of the time constant of the loop filter 14 by using the circuit construction of FIG. 3C. A resistor R21 is inserted between outputs of the phase comparator 13, thereby supplying output signals as balance (differential) signals to control voltage input terminals of the VCO 15. A resistor R22, capacitors C21 and C22, and a resistor R23 are serially connected between one output of the phase comparator 13 and the ground. A collector of a transistor Tr21 is connected to a connection point of the capacitors C21 and C22 and this connection point is connected to the ground through collector-emitter of the transistor Tr21. A control signal is supplied to a base of the transistor Tr21.

A resistor R24, capacitors C23 and C24, and a resistor R25 are serially connected between the other output of the phase comparator 13 and the ground. A collector of a transistor Tr22 is connected to a connection point of the capacitors C23 and C24 and this connection point is connected to the ground through collector-emitter of the transistor Tr22. A control signal is supplied to a base of the transistor Tr22. Since the control signals which are supplied to the transistors Tr21 and Tr22 are the same signal, the ON/OFF operations of the transistors Tr21 and Tr22 are certainly simultaneously performed.

Figure 4B:
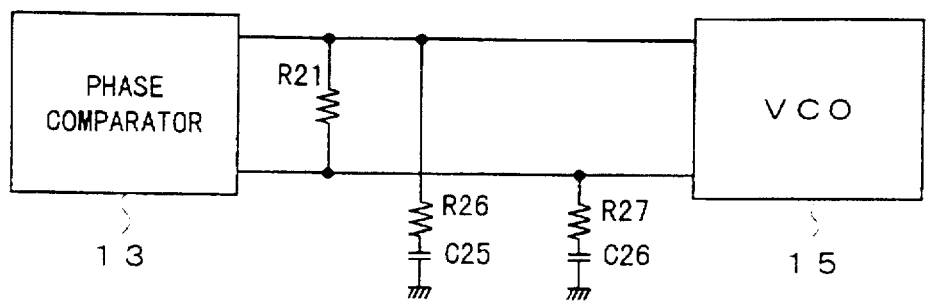

When the control signal which is supplied to the base of the transistor Tr21 is at the high level, the transistor Tr21 is turned ON. The capacitor C22 and resistor R23 are short-circuited. Similarly, the control signal which is supplied to the base of the transistor Tr22 is also set to the high level, so that the transistor Tr22 is turned ON. The capacitor C24 and resistor R25 are short-circuited. FIG. 4B shows an equivalent circuit when the control signal is at the high level as mentioned above.

Values of resistors R26 and R27 and capacitors C25 and C26 shown in FIG. 4B are shown below.

R26=R22
R27=R24
C25=C21
C26=C23

Figure 4C:
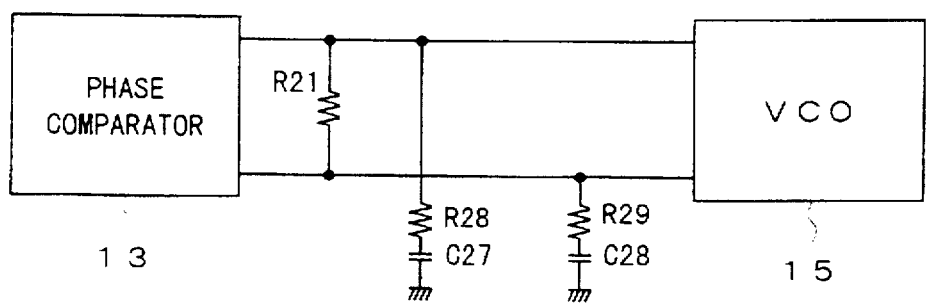

When the control signal which is supplied to the base of the transistor Tr21 is at the low level, the transistor Tr21 is turned OFF. No current flows between the collector and the emitter of the transistor Tr21. Similarly, since the control signal which is supplied to the base of the transistor Tr22 is also set to the low level, the transistor Tr22 is turned OFF. No current flows between the collector and the emitter of the transistor Tr22. FIG. 4C shows an equivalent circuit when the control signal is set to the low level as mentioned above.

Values of resistors R28 and R29 and capacitors C27 and C28 shown in FIG. 4C are shown below.

R28=R22+R23
R29=R24+R25
C27=C21×C22/(C21+C22)
C28=C23×C24/(C23+C24)

Figure 5:
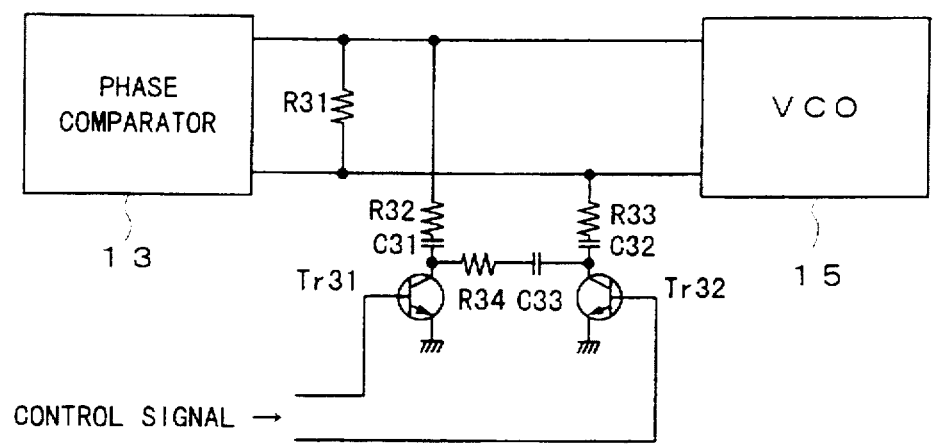
FIG. 5 is a circuit diagram of a loop filter according to another embodiment of the invention.
Figure 6:
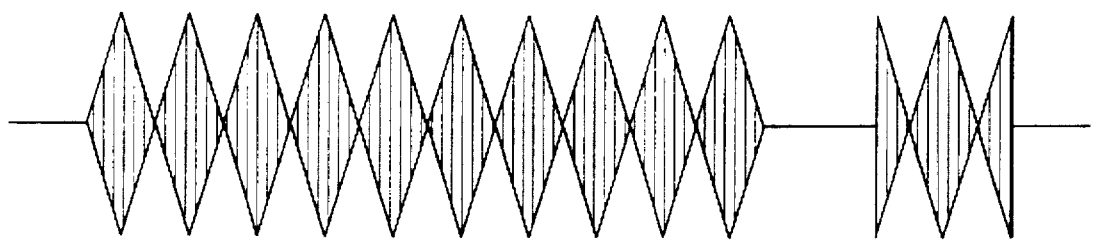
FIG. 6 shows an RF waveform in a variable speed reproducing mode.

FIG. 5 shows another embodiment of a circuit construction which realizes the switching of the time constant of the loop filter 14. A resistor R31 is inserted between the outputs of the phase comparator 13 and output signals are supplied as balance (differential) signals to control voltage input terminals of the VCO 15. A resistor R32 and a cappacitor C31 are serially connected between one output of the phase comparator 13 and the collector of a transistor Tr31. An emitter of the transistor Tr31 is connected to the ground. A resistor R33 and a capacitor C32 are serially connected between the other output of the phase comparator 13 and a collector of a transistor Tr32. An emitter of the transistor Tr32 is connected to the ground.

A resistor R34 and a capacitor C33 are connected between the collector of the transistor Tr31 and the collector of the transistor Tr32. Control signals are supplied to bases of the transistors Tr31 and Tr32.

Values of the resistor R34 and capacitor C33 shown in FIG. 5 are shown below.

R34=R23+R25
C33=C22×C24/2

As mentioned above, by properly selecting the values of the resistors R22 to R25 and capacitors C21 to C24 shown in FIG. 4A or the values of the resistors R32 to R34 and capacitors C31 to C33 shown in FIG. 5, two kinds of desired time constants can be realized.

As mentioned above, according to the conventional method, when a bipolar transistor is used, a base current of hundreds of [μA] flows from the emitter of the bipolar transistor in the ON state, so that a balance of the balance signals is broken. The bipolar transistor, consequently, cannot be used. By using the circuit construction shown in the embodiment, however, no base current flows to the resistors and capacitors, namely, a balance of the balance signals is not broken. Thus, the transistor can be used.

A magnetic recording and reproducing apparatus using a PLL according to the invention will now be described with reference to FIG. 7. In FIG. 7, reference numerals 21A and 21B denote a pair of heads which face on a rotary drum at an interval of 180°. A magnetic tape 22 is wrapped around the drum at an angle which is slightly larger than 180°. The heads 21A and 21B alternately trace the magnetic tape 22. A signal is transmitted and received to/from the heads 21A and 21B through a rotary transformer 23. For example, the rotary transformer 23 has a construction such that a rotor yoke which is rotated integratedly with the drum and a fixed stator yoke face each other and a winding is arranged in a groove formed in each yoke.

A digital video signal, digital audio signals, and a subcode to be recorded are supplied to an input terminal 24. In a source coding circuit 25, t hose signals are compression encoded and are also subjected to a coding process of an error correction code. An output signal of the source coding circuit 25 is supplied to a channel coding circuit 26. The channel coding circuit 26 digitally modulates a recording digital signal. For example, by mapping data of 24 bits into data of 25 bits, a recording digital signal whose DC component is reduced is obtained.

An output signal of the channel coding circuit 26 is supplied to a recording amplifier 27. A recording/reproduction change-over switch 28A is constructed by an output terminal r and a ground terminal p of the recording amplifier 27. The switch 28A is controlled by a recording/reproduction switching signal formed by the channel coding circuit 26. Namely, upon recording, the terminal r of the switch 28A is selected. Upon reproduction, the terminal p connected to the ground is selected. An output signal of the recording amplifier 27 is supplied to the heads 21A and 21B through the terminal r of the switch 28A and the rotary transformer 23 and is recorded onto the magnetic tape 22. Upon reproduction, the terminal p is selected and no recording signal is supplied to the heads 21A and 21B.

The signals reproduced by the heads 21A and 21B are supplied to a reproducing amplifier 31 through the rotary transformer 23 and a recording/reproduction change-over switch 28B. In a manner similar to the switch 28A, the switch 28B has a recording side terminal r and a reproduction side terminal p and is controlled by the recording/reproduction switching signal from the channel coding circuit 26. An output signal of the reproducing amplifier 31 is supplied to a channel decoding circuit 32. The channel decoding circuit 32 executes processes opposite to the processes executed by the channel coding circuit 26 of a recording system. A source decoding circuit 33 is connected to the channel coding circuit 32. The source decoding circuit 33 executes processes opposite to the processes executed by the source coding circuit 25 of the recording system. A reproduction video signal, reproduction audio signals, and a reproduction subcode are fetched to an output terminal 34 of the source decoding circuit 33.

A clock reproduced by a PLL-IC 11 is used for a decoding process of the channel decoding circuit 32. A TBC (time base compensator) is included in the channel decoding circuit 32. An output signal in which a time base fluctuation of the reproduction signal was eliminated is generated from the TBC. The clock reproduced by the PLL-IC 11 specifies a timing for a signal process up to the input side (writing side) of the TBC. A timing after the output side (reading side) of the TBC is specified on the basis of a clock of a fixed frequency.

A signal transmitted through a switch 35 is supplied as a reference signal to the PLL-IC 11. The switch 35 has an input terminal R connected to the output of the channel coding circuit 26 and an input terminal P connected to the output of the reproducing amplifier. The switch 35 is controlled by the control signals to control the recording/reproduction changeover switches 28A and 28B. Namely, in a manner similar to the switches 28A and 28B, the switch 35 selects the input terminal R upon recording and selects the input terminal P upon reproduction.

According to the invention, the operation in which the response characteristics of the PLL having therein the circuit is switched on the basis of a balance form and which is conventionally difficult can be performed. Since the invention is also effective in a low power source voltage circuit, it is also remarkably effective to reduce an electric power consumption of the circuit.

The present invention is not limited to the foregoing embodiment but many modifications and variations are possible within the spirit and scope of the appended claims of the invention.

What is claimed is:

1. A PLL circuit, comprising:
   a VCO;
   a phase comparator for comparing phases of input signals and output signals of said VCO; and
   a loop filter inserted between output terminals of said phase comparator and control signal input terminals of said VCO,
   wherein said loop filter has switching means for switching a first time constant and a second time constant, and output signals of said phase comparator and output signals of said loop filter whose first and second time constants are switched have a form of balance signals, said switching means comprising a bipolar transistor, an emitter of said bipolar transistor being connected to a ground.

2. A PLL circuit, comprising:
   a VCO;
   a phase comparator for comparing phases of input signals and output signals of said VCO; and
   a loop filter inserted between output terminals of said phase comparator and control signal input terminals of said VCO,
   wherein said loop filter has switching means for switching a first time constant and a second time constant, and output signals of said phase comparator and output signals of said loop filter whose first and second time constants are switched have a form of balance signals said loop filter further comprising:
   a first resistor, a first capacitor, a second capacitor, and a second resistor which are serially connected between one output of said phase comparator and a ground;
   a first bipolar transistor whose collector is connected to a connection point of said first and second capacitors and whose emitter is connected to the ground;
   a third resistor, a third capacitor, a fourth capacitor, and a fourth resistor are serially connected between another output of said phase comparator and the ground; and
   a second bipolar transistor whose collector is connected to a connection point of said third and fourth capacitors and whose emitter is connected to the ground.

3. A PLL circuit, comprising:
   a VCO;
   a phase comparator for comparing phases of input signals and output signals of said VCO; and a loop filter inserted between output terminals of said phase comparator and control signal input terminals of said VCO, wherein said loop filter has switching means for switching a first time constant and a second time constant, and output signals of said phase comparator and output signals of said loop filter whose first and second time constants are switched have a form of balance signals, said loop filter further comprising:

a first resistor and a first capacitor which are serially connected to a first output of said phase comparator;

a first bipolar transistor whose collector is connected to said first capacitor and whose emitter is connected to a ground;

a second resistor and a second capacitor which are serially connected to a second output of said phase comparator;

a second bipolar transistor whose collector is connected to said second capacitor and whose emitter is connected to the ground; and a third resistor and a third capacitor which are serially connected between the collector of said first bipolar transistor and the collector of said second bipolar transistor.

4. A digital signal reproducing apparatus to which an information signal is supplied and which forms a reproducing clock synchronously with said information signal and reproduces the information signal comprises:

A VCO;

a phase comparator for comparing phases of input signals and output signals of said VCO; and a loop filter inserted between output terminals of said phase comparator and control signal input terminals of said VCO, wherein output signals of said phase comparator and output signals of said loop filter whose first and second time constants are switched by a switching means in accordance with a reproducing mode of said digital signal reproducing apparatus have a form of balance signals, wherein said switching means comprises a bipolar transistor, an emitter of said bipolar transistor being connected to a ground.

5. A digital signal reproducing apparatus to which an information signal is supplied and which forms a reproducing clock synchronously with said information signal and reproduces the information signal comprises:

A VCO;

a phase comparator for comparing phases of input signals and output signals of said VCO; and a loop filter inserted between output terminals of said phase comparator and control signal input terminals of said VCO, wherein output signals of said phase comparator and output signals of said loop filter whose first and second time constants are switched in accordance with a reproducing mode of said digital signal reproducing apparatus have a form of balance signals, said loop filter further comprising:

a first resistor, a first capacitor, a second capacitor, and a second resistor which are serially connected between a first output of said phase comparator and a ground;

a first bipolar transistor whose collector is connected to a connection point of said first and second capacitors and whose emitter is connected to the ground;

a third resistor, a third capacitor, a fourth capacitor, and a fourth resistor which are serially connected between a second output of said phase comparator and the ground; and a second bipolar transistor whose collector is connected to a connection point of said third and fourth capacitors and whose emitter is connected to the ground.

6. A digital signal reproducing apparatus to which an information signal is supplied and which forms a reproducing clock synchronously with said information signal and reproduces the information signal comprises:

A VCO;

a phase comparator for comparing phases of input signals and output signals of said VCO; and a loop filter inserted between output terminals of said phase comparator and control signal input terminals of said VCO.

wherein output signals of said phase comparator and output signals of said loop filter whose first and second time constants are switched in accordance with a reproducing mode of said digital signal reproducing apparatus have a form of balance signals, said loop filter further comprising:

a first resistor and a first capacitor which are serially connected to a first output of said phase comparator;

a first bipolar transistor whose collector is connected to said first capacitor and whose emitter is connected to a ground;

a second resistor and a second capacitor which are serially connected to a second output of said phase comparator;

a second bipolar transistor whose collector is connected to said second capacitor and whose emitter is connected to the ground; and a third resistor and a third capacitor which are serially connected between the collectors of said first and second bipolar transistors.

* * * * *